US010008529B2

(12) United States Patent
Nakashikiryo et al.

(10) Patent No.: US 10,008,529 B2
(45) Date of Patent: Jun. 26, 2018

(54) SOLID-STATE IMAGING DEVICE, METHOD OF MANUFACTURING THE SAME, AND ELECTRONIC APPARATUS

(71) Applicant: SONY SEMICONDUCTOR SOLUTIONS CORPORATION, Kanagawa (JP)

(72) Inventors: Takashi Nakashikiryo, Kumamoto (JP); Yoshiaki Kitano, Kumamoto (JP); Yuuji Nishimura, Kumamoto (JP); Kouichi Itabasi, Kumamoto (JP); Ryou Chiba, Kumamoto (JP); Yosuke Takita, Kumamoto (JP); Mitsuru Ishikawa, Kumamoto (JP); Toyomi Jinwaki, Kumamoto (JP); Yuichi Seki, Kumamoto (JP); Masaya Shimoji, Kumamoto (JP); Yoichi Ootsuka, Kanagawa (JP); Takafumi Nishi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days. days.

(21) Appl. No.: 15/512,131

(22) PCT Filed: Sep. 17, 2015

(86) PCT No.: PCT/JP2015/076414
§ 371 (c)(1),
(2) Date: Mar. 17, 2017

(87) PCT Pub. No.: WO2016/052220
PCT Pub. Date: Apr. 7, 2016

(65) Prior Publication Data
US 2017/0278889 A1    Sep. 28, 2017

(30) Foreign Application Priority Data

Oct. 1, 2014   (JP) ................................ 2014-203001

(51) Int. Cl.
*H01L 27/146* (2006.01)

(52) U.S. Cl.
CPC .. *H01L 27/14627* (2013.01); *H01L 27/14621* (2013.01); *H01L 27/14623* (2013.01); *H01L 27/14685* (2013.01)

(58) Field of Classification Search
CPC ........... H01L 27/14627; H01L 27/1462; H01L 21/0276; H01L 21/32139; H01L 31/02161
See application file for complete search history.

(56) References Cited

U.S. PATENT DOCUMENTS

| 2013/0249031 A1* | 9/2013 | Oganesian | ........ H01L 27/14627 257/432 |
| 2014/0218572 A1* | 8/2014 | Ootsuka | ............ H01L 27/14621 348/280 |

FOREIGN PATENT DOCUMENTS

| JP | 2002-280534 A | 9/2002 |
| JP | 2010-186818 A | 8/2010 |
| JP | 2012-084608 A | 4/2012 |

\* cited by examiner

*Primary Examiner* — Quoc Hoang
(74) *Attorney, Agent, or Firm* — Chip Law Group

(57) ABSTRACT

The present disclosure relates to a solid-state imaging device that enables diffusion of components in the interfaces between microlenses and an antireflection film, a method of manufacturing the solid-state imaging device, and an electronic apparatus. Moisture permeation holes are formed between the microlenses of adjacent pixels. The moisture permeation holes are covered with an antireflection film. The antireflection film is formed on the surfaces of the microlenses excluding the diffusion holes. The refractive index of the antireflection film is higher than the refractive index of the microlenses. The present disclosure can be applied to complementary metal oxide semiconductor (CMOS) image sensors that are back-illuminated solid-state imaging devices, for example.

12 Claims, 11 Drawing Sheets

SOLID-STATE IMAGING DEVICE, METHOD OF MANUFACTURING THE SAME, AND ELECTRONIC APPARATUS

CROSS REFERENCE TO RELATED APPLICATIONS

This application is a U.S. National Phase of International Patent Application No. PCT/JP2015/076414 filed on Sep. 17, 2015, which claims priority benefit of Japanese Patent Application No. JP 2014-203001 filed in the Japan Patent Office on Oct. 1, 2014. Each of the above-referenced applications is hereby incorporated herein by reference in its entirety.

TECHNICAL FIELD

The present disclosure relates to a solid-state imaging device, a method of manufacturing the solid-state imaging device, and an electronic apparatus, and more particularly, to a solid-state imaging device that enables diffusion of components in the interfaces between microlenses and an antireflection film, a method of manufacturing the solid-state imaging device, and an electronic apparatus.

BACKGROUND ART

As the solid-state imaging devices for compact digital cameras and mobile cameras, back-illuminated solid-state imaging devices (BSIs) have been developed to improve the sensitivity and the shading characteristics of fine pixels (see Patent Document 1, for example).

A BSI can be employed as a solid-state imaging device for a digital still camera that takes images of APS, 35 mm, or type 1 in size. However, such a digital still camera has a sufficiently large pixel size (1.980 µm or larger, for example), and therefore, has low cost-effectiveness. For this reason, introduction of BSIs was delayed. However, even such a digital still camera is expected to capture high-sensitivity, high-definition images these days, and introduction of BSIs is being considered.

A BSI can have photodiodes with a larger area than in a front-illuminated solid-state imaging device (FSI). Furthermore, any multilayer metal interconnect is not provided on the light entering side, and accordingly, incident light can be efficiently taken into photodiodes. As a result, sensitivity characteristics are improved.

On the other hand, since the area of each photodiode is large, and any multilayer metal interconnect is provided on the light entering side, the photodiodes capture too much reflection light from a sealing glass surface, an infrared cut filter (IRCF), an optical system, and the like, which are provided on the illuminated side of the microlenses. As a result, flare, ghosts, and color mixing easily occur, and degrade the quality of captured images.

In a suggested measure against the above, two inorganic films are provided as antireflection films on the surfaces of the microlenses, to prevent occurrences of flare, ghosts, color mixing, and the like (Patent Document 2, for example).

CITATION LIST

Patent Documents

Patent Document 1: Japanese Patent Application Laid-Open No. 2010-186818

Patent Document 2: Japanese Patent Application Laid-Open No. 2012-84608

SUMMARY OF THE INVENTION

Problems to be Solved by the Invention

In a case where an antireflection film is provided on the surfaces of the microlenses, however, if BSIs are left in a high-temperature, high-humidity condition for a long period of time, the moisture generated in part of the regions of the interfaces between the microlenses and the antireflection film might not permeate through the antireflection film but remain therein, resulting in generation of water droplets. In this case, the captured image is stained by the water droplets, and the quality of the image is degraded.

The present disclosure has been made in view of those circumstances, and is to enable diffusion of components in the interfaces between microlenses and an antireflection film.

Solutions to Problems

A solid-state imaging device of a first aspect of the present disclosure is a solid-state imaging device that includes: microlenses of respective pixels; diffusion holes that are formed between the microlenses of the pixels adjacent to one another, and are covered with an inorganic film; and a first antireflection film that is formed on the surfaces of the microlenses excluding the diffusion holes, and has a higher refractive index than that of the microlenses.

The first aspect of the present disclosure provides microlenses of respective pixels, diffusion holes that are formed between the microlenses of the pixels adjacent to one another and are covered with an inorganic film, and a first antireflection film that is formed on the surfaces of the microlenses excluding the diffusion holes and has a higher refractive index than that of the microlenses.

A manufacturing method of a second aspect of the present disclosure is a method of manufacturing a solid-state imaging device that includes: microlenses of respective pixels; diffusion holes that are formed between the microlenses of the pixels adjacent to one another, and are covered with an inorganic film; and a first antireflection film that is formed on the surfaces of the microlenses excluding the diffusion holes, and has a higher refractive index than that of the microlenses.

In the second aspect of the present disclosure, a solid-state imaging device is manufactured, the solid-state imaging device including: microlenses of respective pixels; diffusion holes that are formed between the microlenses of the pixels adjacent to one another, and are covered with an inorganic film; and a first antireflection film that is formed on the surfaces of the microlenses excluding the diffusion holes, and has a higher refractive index than that of the microlenses.

An electronic apparatus of a third aspect of the present disclosure is an electronic apparatus that includes: microlenses of respective pixels; diffusion holes that are formed between the microlenses of the pixels adjacent to one another, and are covered with an inorganic film; and a first antireflection film that is formed on the surfaces of the microlenses excluding the diffusion holes, and has a higher refractive index than that of the microlenses.

The third aspect of the present disclosure provides microlenses of respective pixels, diffusion holes that are formed between the microlenses of the pixels adjacent to one another and are covered with an inorganic film, and a first antireflection film that is formed on the surfaces of the microlenses excluding the diffusion holes and has a higher refractive index than that of the microlenses.

A solid-state imaging device of a fourth aspect of the present disclosure is a solid-state imaging device that includes: microlenses of respective pixels; diffusion holes formed between the microlenses of the pixels adjacent to one another; and an antireflection film formed on the surfaces of the microlenses excluding the diffusion holes.

The fourth aspect of the present disclosure provides microlenses of respective pixels, diffusion holes formed between the microlenses of the pixels adjacent to one another, and an antireflection film formed on the surfaces of the microlenses excluding the diffusion holes.

A manufacturing method of a fifth aspect of the present disclosure is a method of manufacturing a solid-state imaging device that includes: microlenses of respective pixels; diffusion holes formed between the microlenses of the pixels adjacent to one another; and an antireflection film formed on the surfaces of the microlenses excluding the diffusion holes.

In the fifth aspect of the present disclosure, a solid-state imaging device is manufactured, the solid-state imaging device including: microlenses of respective pixels; diffusion holes formed between the microlenses of the pixels adjacent to one another; and an antireflection film formed on the surfaces of the microlenses excluding the diffusion holes.

An electronic apparatus of a sixth aspect of the present disclosure is an electronic apparatus that includes: microlenses of respective pixels; diffusion holes formed between the microlenses of the pixels adjacent to one another; and an antireflection film formed on the surfaces of the microlenses excluding the diffusion holes.

The sixth aspect of the present disclosure provides microlenses of respective pixels, diffusion holes formed between the microlenses of the pixels adjacent to one another, and an antireflection film formed on the surfaces of the microlenses excluding the diffusion holes.

Effects of the Invention

According to the first, third, fourth, and sixth aspects of the present disclosure, imaging can be performed. Also, according to the first, third, fourth, and sixth aspects of the present disclosure, components in the interfaces between microlenses and an antireflection film can be diffused.

Further, according to the second and fifth aspects of the present disclosure, a solid-state imaging device can be manufactured. According to the second and fifth aspects of the present disclosure, a solid-state imaging device that can diffuse components in the interfaces between microlenses and an antireflection film can be manufactured.

It should be noted that effects of the present technology are not limited to the effects described above, and may include any of the effects described in the present disclosure.

MODES FOR CARRYING OUT THE INVENTION

The following is a description of modes (hereinafter referred to as embodiments) for carrying out the present disclosure. It should be noted that explanation will be made in the following order.

1. First Embodiment: Complementary Metal Oxide Semiconductor (CMOS) Image Sensor (FIGS. 1 through 10)
2. Second Embodiment: CMOS Image Sensor (FIG. 11)
3. Third Embodiment: Imaging Apparatus (FIG. 12)

First Embodiment (Example Configuration of a First Embodiment of a CMOS Image Sensor)

Figure 1:
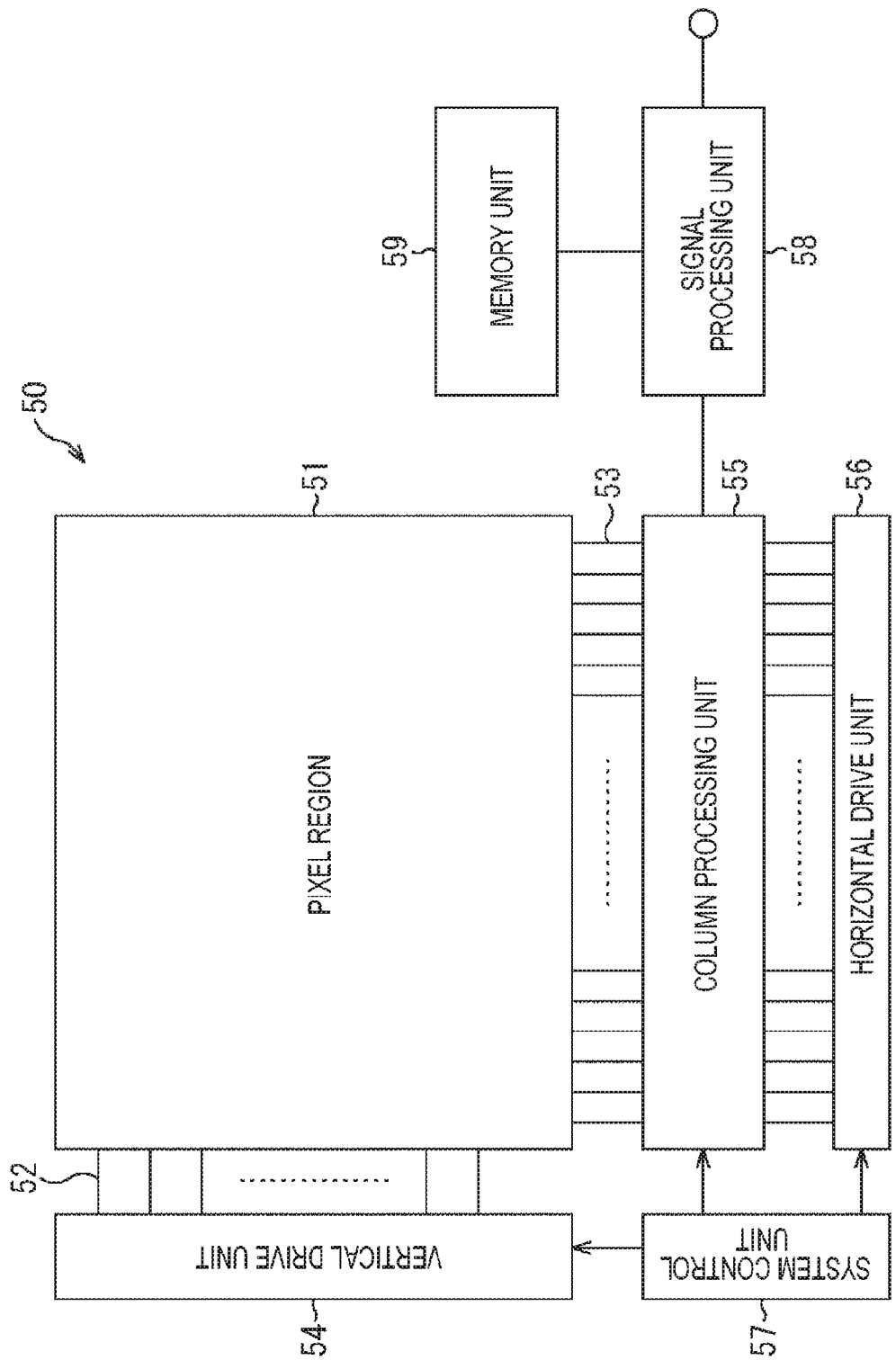
FIG. 1 is a diagram showing an example configuration of a first embodiment of a CMOS image sensor as a solid-state imaging device to which the present disclosure is applied.

FIG. 1 is a diagram showing an example configuration of a first embodiment of a CMOS image sensor as a solid-state imaging device to which the present disclosure is applied.

A CMOS image sensor 50 is a BSI. The CMOS image sensor 50 includes a pixel region 51, pixel drive lines 52, vertical signal lines 53, a vertical drive unit 54, a column processing unit 55, a horizontal drive unit 56, a system control unit 57, a signal processing unit 58, and a memory unit 59, which are formed on a semiconductor substrate (a chip) (not shown in the drawing), such as a silicon substrate.

Pixels are two-dimensionally arranged in a matrix fashion in the pixel region 51 of the CMOS image sensor 50. Each pixel performs imaging, having a photoelectric conversion element that generates a quantity of charge corresponding to the quantity of incident light and stores the charge therein. Further, in the pixel region 51, the pixel drive lines 52 are formed for the respective rows for the pixels in the matrix state, and the vertical signal lines 53 are formed for the respective columns.

The vertical drive unit 54 is formed with a shift register, an address decoder, and the like, and drives the respective pixels in the pixel region 51 row by row, for example. One end of each of the pixel drive lines 52 is connected to the corresponding one of the output terminals (not shown) of the vertical drive unit 54 corresponding to the respective rows. Although the configuration of the vertical drive unit 54 is not specifically shown in the drawing, the vertical drive unit 54 has a configuration that includes two scanning systems: a read scanning system and a sweep scanning system.

To read pixel signals from the respective pixels row by row, the read scanning system sequentially selects each row, and outputs a select signal or the like from the output terminal connected to the pixel drive line 52 of the selected row. In turn, the pixels of the row selected by the read scanning system read out the electrical signals of the charges stored in the photoelectric conversion elements as pixel signals, and supplies the electrical signals to the vertical signal lines 53.

To sweep (reset) unnecessary charges from the photoelectric conversion elements, the sweep scanning system outputs reset signals from the output terminals connected to the pixel drive lines 52 of the respective rows, only the time equivalent to the shutter speed earlier than the scanning to be performed by the read scanning system. Through the scanning performed by the sweep scanning system, a so-called electronic shutter operation is sequentially performed for each row. Here, an electronic shutter operation is an operation to discard optical charges of the photoelectric conversion elements, and newly start exposure (start accumulating charges).

The column processing unit 55 includes signal processing circuits for the respective columns in the pixel region 51. Each signal processing circuit of the column processing unit 55 performs a denoising process such as correlated double sampling (CDS), and signal processing such as an A/D conversion process, on the pixel signals that are output from the respective pixels of the selected row through the vertical signal lines 53. The column processing unit 55 temporarily holds the pixel signals subjected to the signal processing.

The horizontal drive unit 56 is formed with a shift register, an address decoder, and the like, and sequentially selects the signal processing circuits of the column processing unit 55. As a result of this selective scanning by the horizontal drive unit 56, the pixel signals subjected to the signal processing by the respective signal processing circuits of the column processing unit 55 are sequentially output to the signal processing unit 58.

The system control unit 57 includes a timing generator that generates various timing signals. In accordance with the various timing signals generated by the timing generator, the system control unit 57 controls the vertical drive unit 54, the column processing unit 55, and the horizontal drive unit 56.

The signal processing unit 58 includes at least an addition process function. The signal processing unit 58 performs various kinds of signal processing such as an addition process for the pixel signals output from the column processing unit 55. At such times, the signal processing unit 58 stores intermediate results of signal processing into the memory unit 59 as necessary, and refers to the stored results when necessary. The signal processing unit 58 outputs the pixel signals subjected to the signal processing.

The memory unit 59 is formed with a dynamic random access memory (DRAM), a static random access memory (SRAM), or the like.

It should be noted that the illuminated side of the semiconductor substrate of the CMOS image sensor 50 will be hereinafter referred to as the upper side, and the opposite side from the illuminated side will be hereinafter referred to as the lower side, unless otherwise specified. Also, in the description below, the transparent protective film, the sealing glass, the IRCF, and the like, which are provided on the microlenses, will not be explained, since they are not relevant to the subject matter of the present disclosure.

(Structure of the Pixel Region)

Figure 2:
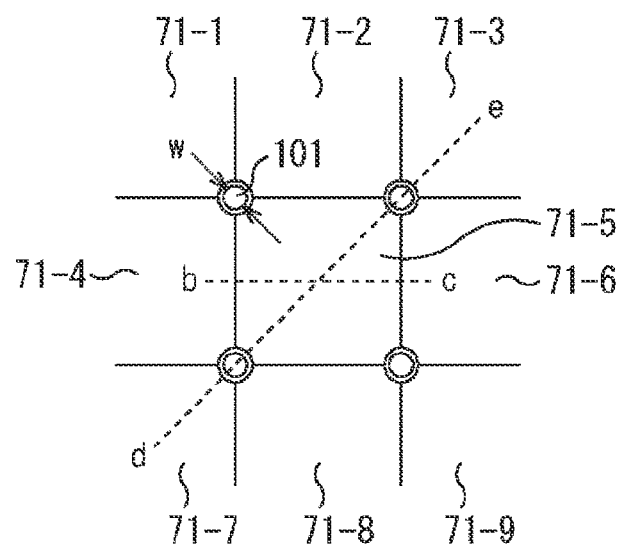
FIG. 2 is a top view of the pixel region shown in FIG. 1.
Figure 3:
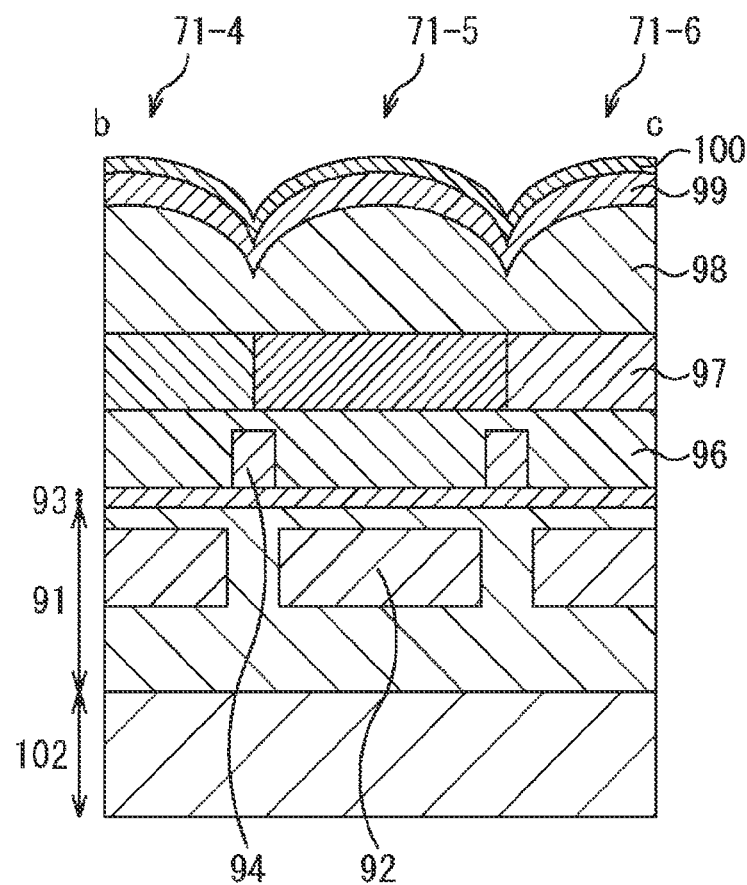
FIG. 3 is a cross-sectional view taken along the line b-c defined in FIG. 2.
Figure 4:
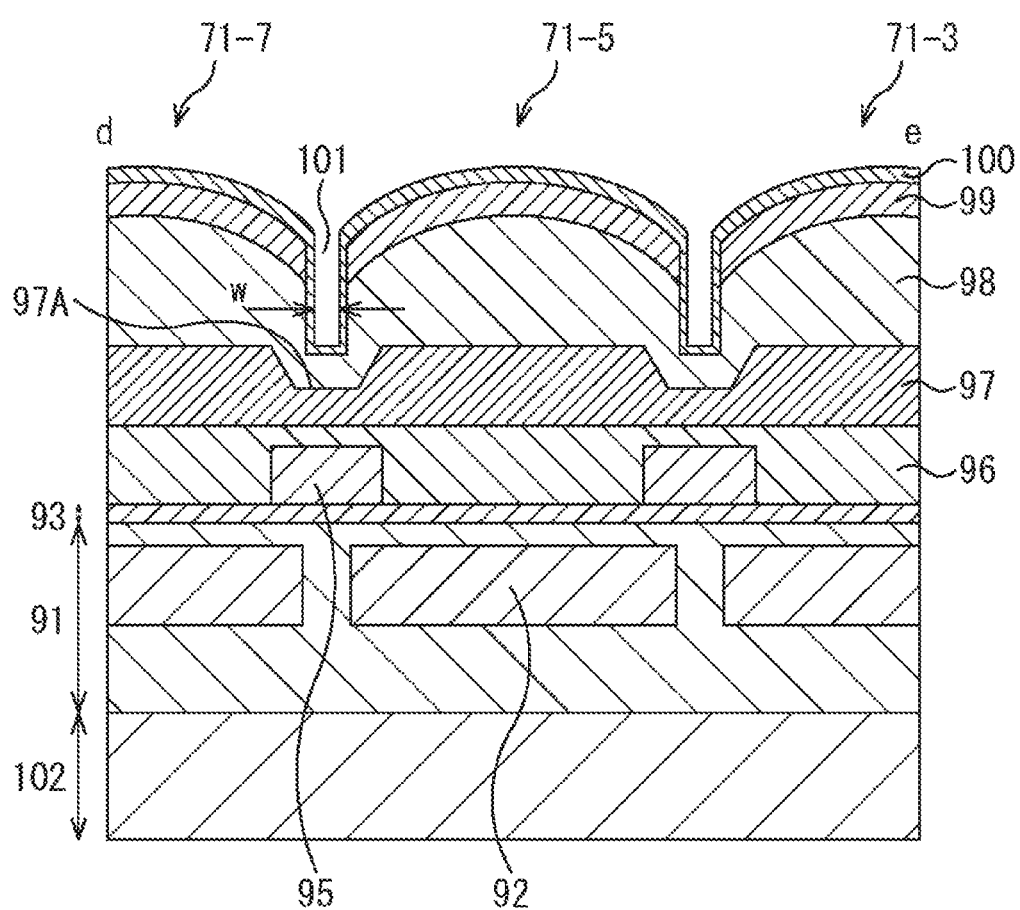
FIG. 4 is a cross-sectional view taken along the line d-e defined in FIG. 2.

FIG. 2 is a top view of the pixel region 51 shown in FIG. 1. FIG. 3 is a cross-sectional view taken along the line b-c defined in FIG. 2. FIG. 4 is a cross-sectional view taken along the line d-e defined in FIG. 2.

It should be noted that, for ease of explanation, FIG. 2 shows only nine pixels 71-1 through 71-9 among the pixels constituting the pixel region 51. In addition, the pixel array in the pixel region 51 is a Bayer array, and the pixels 71-1, 71-3, 71-5, 71-7, and 71-9 are green pixels. Further, the pixels 71-1 through 71-9 will be hereinafter collectively referred to as the pixels 71 when there is no need to specifically distinguish them from one another.

As shown in FIGS. 3 and 4, the pixels 71 are formed on a semiconductor substrate 91, and photodiodes 92 or the like that are photoelectric conversion elements are formed in the semiconductor substrate 91. Further, a gate insulating film 93 is formed on the semiconductor substrate 91. Light shielding portions 94 are formed between the pixels 71 adjacent to one another in the horizontal direction on the gate insulating film 93 as shown in FIG. 3, and light shielding portions 95 are formed between the pixels 71 adjacent to one another in a diagonal direction as shown in FIG. 4.

An insulating film 96 is formed above the semiconductor substrate 91 having the gate insulating film 93, the light shielding portions 94, the light shielding portions 95, and the like formed thereon. This flattens the portion above the semiconductor substrate 91.

As shown in FIGS. 3 and 4, color filters 97 are formed on the insulating film 96. It should be noted that the color filters 97 of the green pixels 71 adjacent to one another in a diagonal direction are joined to one another, and recessed portions 97A that are thinner than the other portions are formed at the joining portions between the color filters 97, as shown in FIG. 4. That is, recessed portions 97A are formed at the four corners of each green pixel 71.

Microlenses 98 are formed on the color filters 97. The microlenses 98 are made of an organic resin such as an acrylic, styrene, or novolac resin containing metal fine particles, or a copolymer resin of those resins.

The refractive index of the microlenses 98 is approximately 1.48 to 1.62, for example. In this case, the surface reflectivity of the microlenses 98 when the medium on the light entering side is air is approximately 3.8 to 5.6%. For example, in a case where the microlenses 98 are made of a polystyrene resin having a refractive index of approximately 1.60, the mean surface reflectance of visible light (light having a wavelength of 400 to 700 nm) of the microlenses 98 is approximately 5.2%.

As shown in FIGS. 2 and 4, moisture permeation holes (diffusion holes) 101 having an opening width w equal to or smaller than the wavelength (400 nm or less, for example) of visible light are formed at the four corners of the microlens 98 of each pixel 71, or between the microlenses 98 of the pixels 71 adjacent to one another in a diagonal direction. That is, the moisture permeation holes 101 are formed above the recessed portions 97A.

Since the width w of the moisture permeation holes 101 is equal to or smaller than the wavelength of visible light, the light collecting characteristics of the microlenses 98 do not deteriorate, and no invalid region is substantially formed among the microlenses 98. Accordingly, sensitivity is not degraded.

An antireflection film 99 is formed on the microlenses 98 excluding the moisture permeation holes 101, and an antireflection film 100 (a second antireflection film) is formed on the antireflection film 99. The antireflection film 99 is an inorganic film such as a silicon nitride film (SiN) or a silicon oxynitride film (SiON), and the refractive index of the antireflection film 99 (a first antireflection film) is higher than the refractive index of the microlenses 98.

The antireflection film 100 is an inorganic film such as a silicon oxide film ($SiO_2$) or a silicon oxycarbide film (SiOC), and the refractive index of the antireflection film 100 is lower than the refractive indexes of the antireflection film 99 and the microlenses 98.

As the antireflection film 99 and the antireflection film 100 described above are formed on the upper surfaces of the microlenses 98, the surface reflectance of the microlenses 98 is lowered.

For example, the mean surface reflectance of the visible light of the microlenses 98 is approximately 1.3% in a case where the size of one side of a pixel 71 is 2.4 μm, the microlenses 98 are made of a polystyrene resin having a refractive index of approximately 1.60, the antireflection film 99 is a SiN film that has a refractive index of approximately 1.86 and a thickness of 120 nm, and the antireflection film 100 is a $SiO_2$ film that has a refractive index of approximately 1.46 and a thickness of 80 nm (this example case will be hereinafter referred to as the two-layer example).

However, in a case where only a $SiO_2$ film that has a refractive index of approximately 1.46 and a thickness of 100 nm is formed on the surfaces of identical microlenses (this example will be hereinafter referred to as the single-layer example), the mean surface reflectance of the visible light of the microlenses is approximately 2.6%, which is twice higher than that in the two-layer example. Further, in a case where any layer is not formed on the surfaces of identical microlenses, the mean surface reflectance of the visible light of the microlenses is approximately 5.2%, which is four times higher than that in the two-layer example.

Also, as the surface reflectance of the microlenses 98 decreases, the sensitivity of the pixels 71 increases. For example, while the sensitivity in the two-layer example is 1.00 a.u., the sensitivity characteristics in the single-layer example are 1.02 a.u.

The antireflection film 100 is also formed on the surfaces of the moisture permeation holes 101. That is, the moisture permeation holes 101 are covered with the antireflection film 100. Because of this, the gaps of the moisture permeation holes 101 become smaller, and thus, generation of any invalid region among the microlenses 98 can be prevented without fail. Also, the moisture permeation holes 101 can be formed, without the use of any expensive manufacturing process, such as excimer laser lithography.

Further, the antireflection film 100 is a highly hydrophilic film. As the antireflection film 100 is formed on the entire pixel region 51 including the moisture permeation holes 101, the cleaning water that is used in wafer dicing after the formation of the pixel region 51 sufficiently spreads in the entire upper portion of the pixel region 51. Thus, even if the width w of the moisture permeation holes 101 has a small value equal to or smaller than the wavelength of visible light, it is possible to effectively remove dust from the upper portion of the pixel region 51.

A multilayer metal interconnect layer 102 is formed on the lower side of the semiconductor substrate 91.

It should be noted that, although the moisture permeation holes 101 are covered with the antireflection film 100 in the first embodiment, the moisture permeation holes 101 may be covered with the antireflection film 99.

(Explanation of the Effects to be Achieved with Moisture Permeation Holes)

Figure 5:
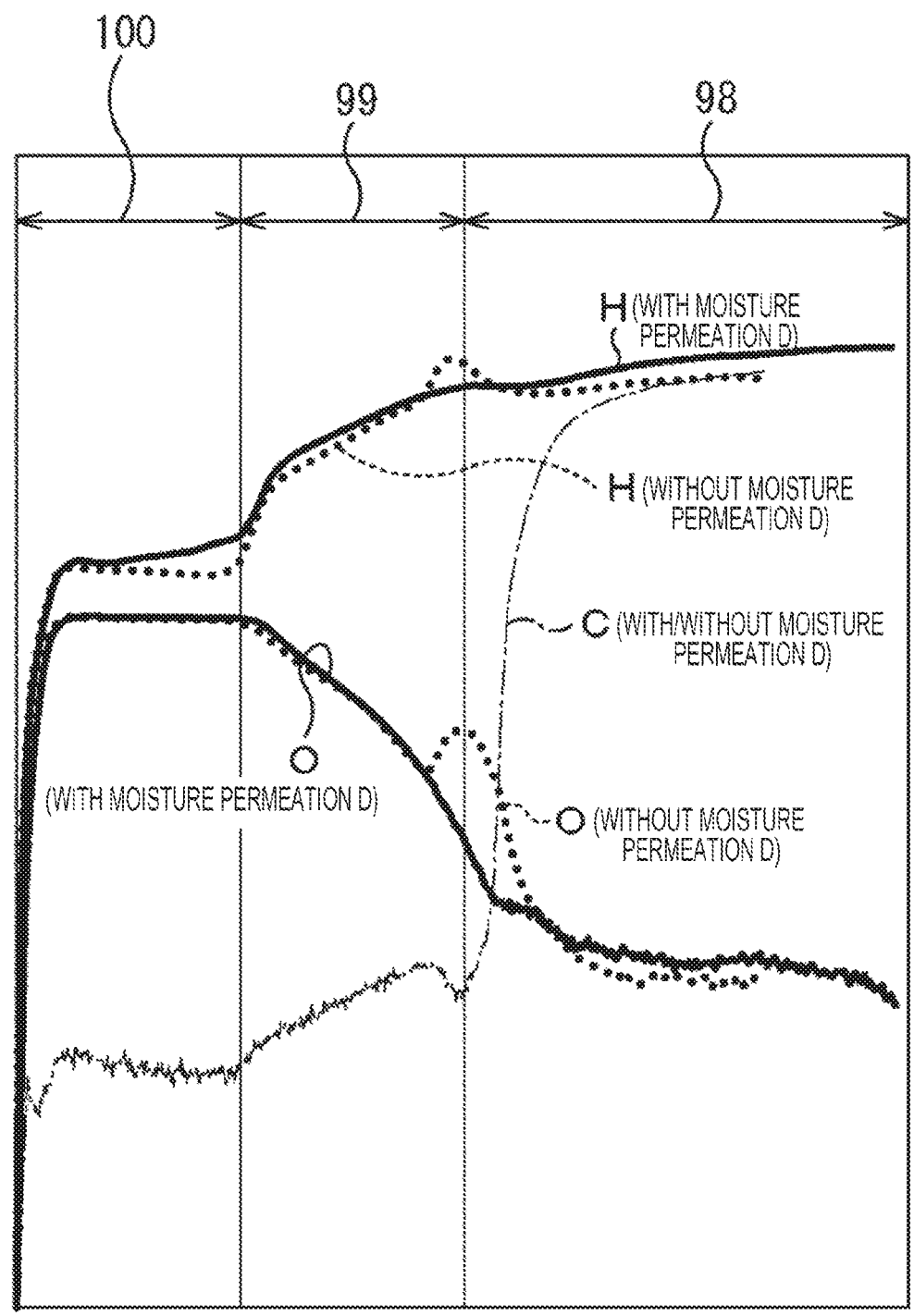
FIG. 5 is a graph showing the results of analysis carried out with SIMS.
Figure 6:
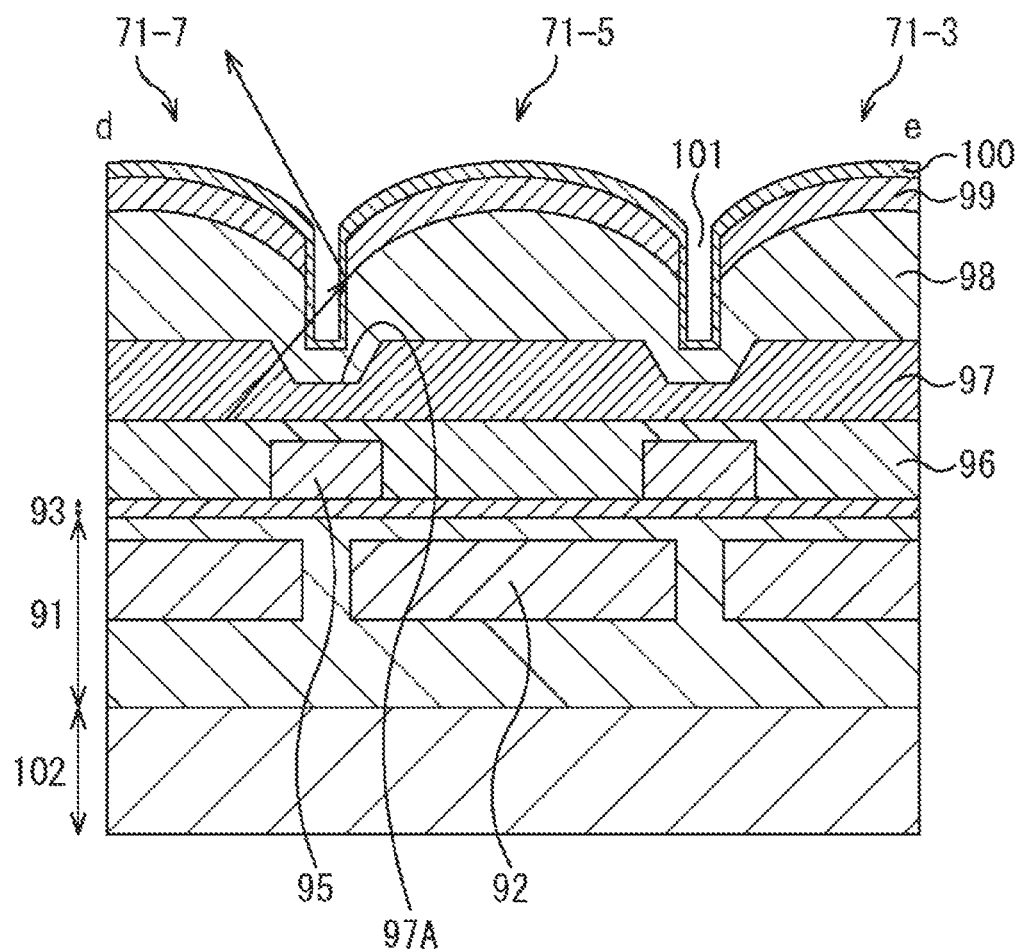
FIG. 6 is a d-e cross-sectional view of a pixel region having moisture permeation holes formed therein.
Figure 7:
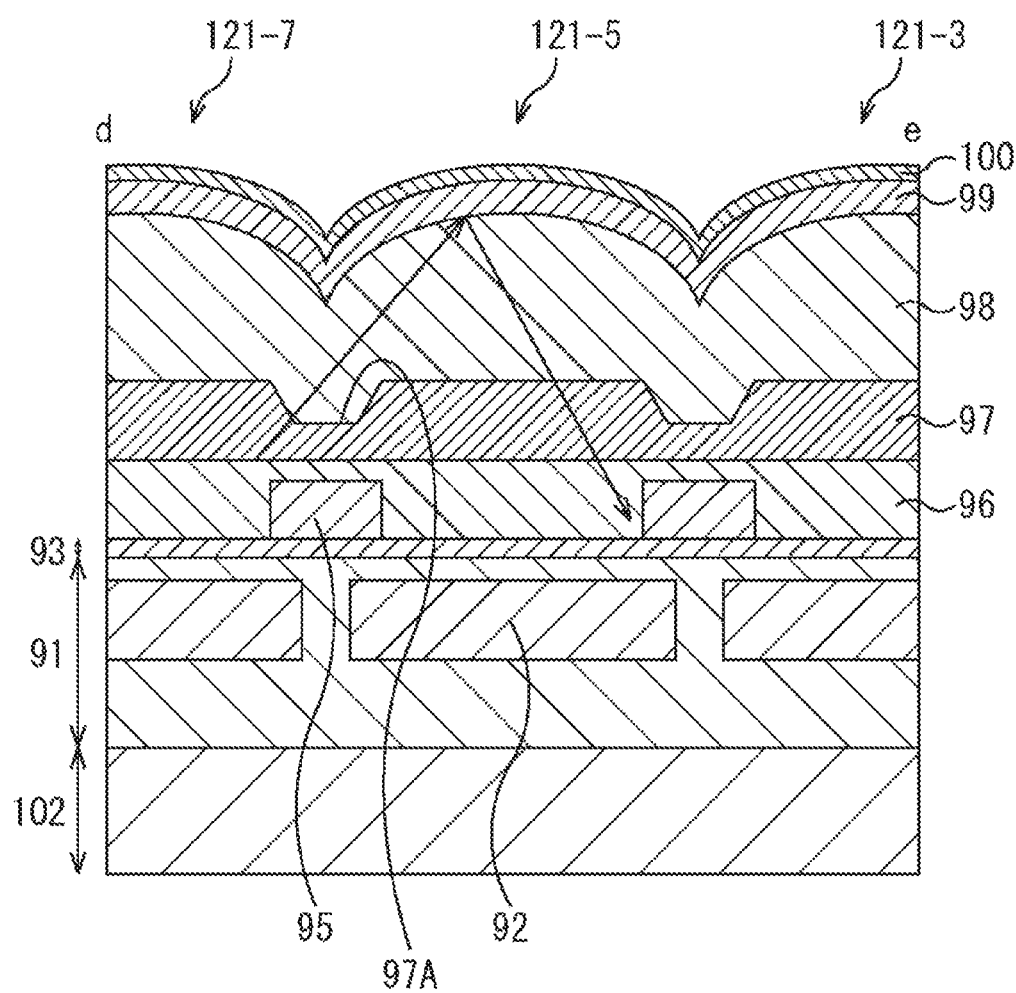
FIG. 7 is a d-e cross-sectional view of a pixel region not having moisture permeation holes formed therein.

FIGS. 5 through 7 are diagrams for explaining the effects to be achieved with the moisture permeation holes 101.

FIG. 5 is a graph showing the results of analysis of a partial region of the antireflection film 100, a partial region of the antireflection film 99, and a partial region of the microlenses 98, which were left for a long time (1000 hours, for example) in a high-temperature, high-humidity condition (at a temperature of 85° C., and a humidity of 85%, for example) in a case where the moisture permeation holes 101 are formed and in a case where the moisture permeation holes 101 are not formed. The analysis was conducted with secondary ion mass spectrometry (SIMS).

In FIG. 5, the abscissa axis indicates the positions of the antireflection film 100, the antireflection film 99, and the microlenses 98 in their thickness direction, and the ordinate axis indicates the amounts of hydrogen (H), oxygen (O), and carbon (C) in the positions. Also, in FIG. 5, the solid lines represent the amounts of hydrogen and oxygen in the case where the moisture permeation holes 101 are formed, and the dotted lines represent the amounts of hydrogen and oxygen in the case where the moisture permeation holes 101 are not formed. Also, the dot-and-dash line represents the amount of carbon, which is the same both in the case where the moisture permeation holes 101 are formed and in the case where the moisture permeation holes 101 are not formed.

The antireflection film 99 is a film with a low moisture permeability. Therefore, in the case where the moisture permeation holes 101 are not formed, the moisture generated in part of the regions of the interfaces between the antireflection film 99 and the microlenses 98 due to the high-temperature, high-humidity condition does not permeate through the antireflection film 99 but remains therein. Consequently, the hydrogen and the oxygen increase in part of the regions of the interfaces between the antireflection film 99 and the microlenses 98, as shown in FIG. 5. That is, water droplets are formed at the interfaces between the antireflection film 99 and the microlenses 98. As a result, the captured image is stained by the water droplets, and the quality of the image is degraded.

In the case where the moisture permeation holes 101 are formed, on the other hand, the moisture generated in part of the regions of the interfaces between the antireflection film 99 and the microlenses 98 is diffused through the moisture permeation holes 101, and thus, the moisture can be prevented from remaining locally in the antireflection film 99. That is, the moisture permeation holes 101 can improve the moisture permeability of the antireflection film 99. Therefore, the hydrogen and the oxygen do not increase at the interfaces between the antireflection film 99 and the microlenses 98 as shown in FIG. 5. In other words, it is possible to reduce the moisture remaining in the interfaces between the antireflection film 99 and the microlenses 98. As a result, it becomes possible to prevent degradation of the quality of a captured image, such as stains caused by residual moisture observed in a structure not having the moisture permeation holes 101.

As described above, the moisture permeation holes 101 are formed so that the CMOS image sensor 50 can have a higher resistance to high-temperature, high-humidity conditions.

Meanwhile, FIG. 6 is a d-e cross-sectional view of the pixel region 51 having the moisture permeation holes 101 formed therein. FIG. 7 is a d-e cross-sectional view of a pixel region not having the moisture permeation holes 101 formed therein. It should be noted that the pixel region shown in FIG. 7 is the same as the pixel region 51, except that the moisture permeation holes 101 are not formed in the microlenses 98. In FIG. 7, the same components as those shown in FIG. 6 are denoted by the same reference numerals as those used in FIG. 6.

As shown in FIG. 6, in the pixel region 51 having the moisture permeation holes 101 formed therein, light that is reflected by the upper surface of the insulating film 96 of the pixel 71-7 and travels toward the pixel 71-5 is reflected by the moisture permeation hole 101 and then travels upward.

In the pixel region not having the moisture permeation holes 101 formed therein, on the other hand, light that is reflected by the upper surface of the insulating film 96 of a pixel 121-7 and travels toward a pixel 121-5 adjacent to the pixel 121-7 is reflected by the microlens 98 of the pixel 121-5 and travels toward the photodiode 92 of the pixel 121-5, as shown in FIG. 7. As a result, the light that should be received by pixel 121-7 is received by the pixel 121-5. That is, color mixing occurs.

Therefore, the moisture permeation holes 101 are formed so that the CMOS image sensor 50 can prevent color mixing.

(Method of Manufacturing the CMOS Image Sensor)

Since the present technology is an invention relating to the portions above the color filters 97 in the CMOS image sensor 50, only the method of manufacturing the portions above the color filters 97 is described below.

Figure 8A:
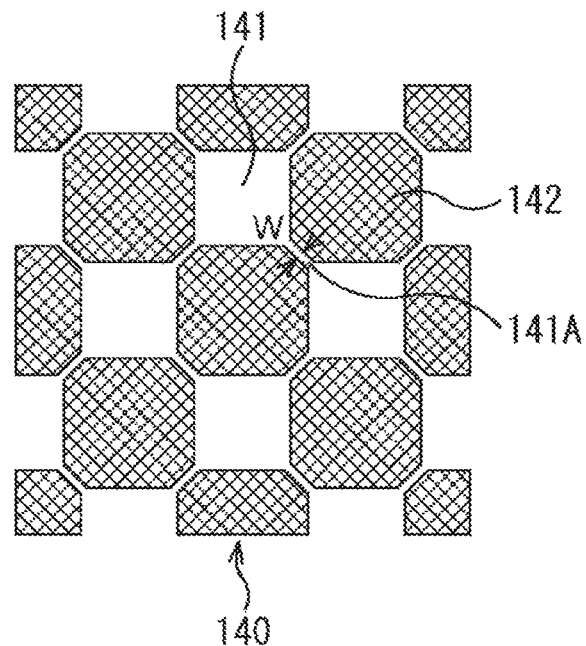
FIGS. 8A and 8B are diagrams for explaining a method of manufacturing green color filters.
Figure 8B:
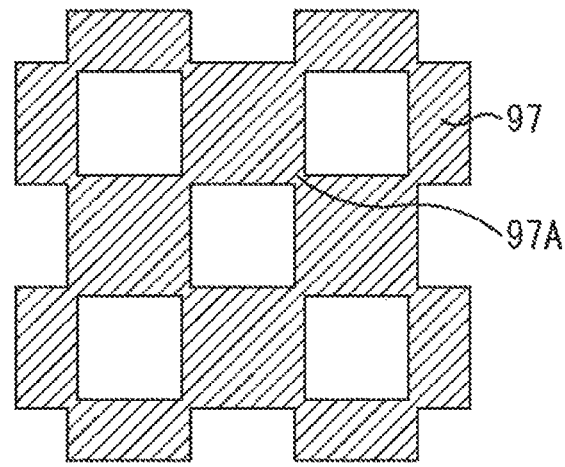

FIGS. 8A and 8B are diagrams for explaining a method of manufacturing the green color filters 97.

When green color filters 97 are manufactured, a photoresist is first applied onto the insulating film 96 of the semiconductor substrate 91. Only predetermined regions are then exposed and developed with a mask pattern.

Specifically, as shown in FIG. 8A, a mask pattern 140 is formed with glass surfaces 141 corresponding to the regions of the green pixels 71 to form the color filters 97, and chrome surfaces 142 corresponding to the regions of pixels 71 of the colors other than green not to form the color filters 97. It should be noted that the glass surfaces 141 of the green pixels 71 diagonally adjacent to one another are joined to one another by joining portions 141A having the width W.

The mask pattern 140 is disposed on the upper surface of the insulating film 96 having the photoresist applied thereonto, and exposure is carried out. With this, light is emitted onto the photoresist in the regions corresponding to the glass surfaces 141, but no light is emitted onto the photoresist in the regions corresponding to the chrome surfaces 142. As a result, the photoresist in the regions corresponding to the glass surfaces 141 is hardened, and the photoresist in the regions corresponding to the chrome surfaces 142 is not hardened.

After that, development is performed to remove the unhardened photoresist. As a result, the color filters 97 shown in FIG. 8B are formed. Since the width W of the joining portions 141A is small at this point of time, recessed portions 97A that are thinner than the other regions are formed at the four corners of each of the green color filters 97 corresponding to the joining portions 141A.

Although the method of manufacturing the green color filters 97 has been described in the example shown in FIGS. 8A and 8B, the methods of manufacturing red and blue color filters 97 are similar to the above described method.

Figure 9:
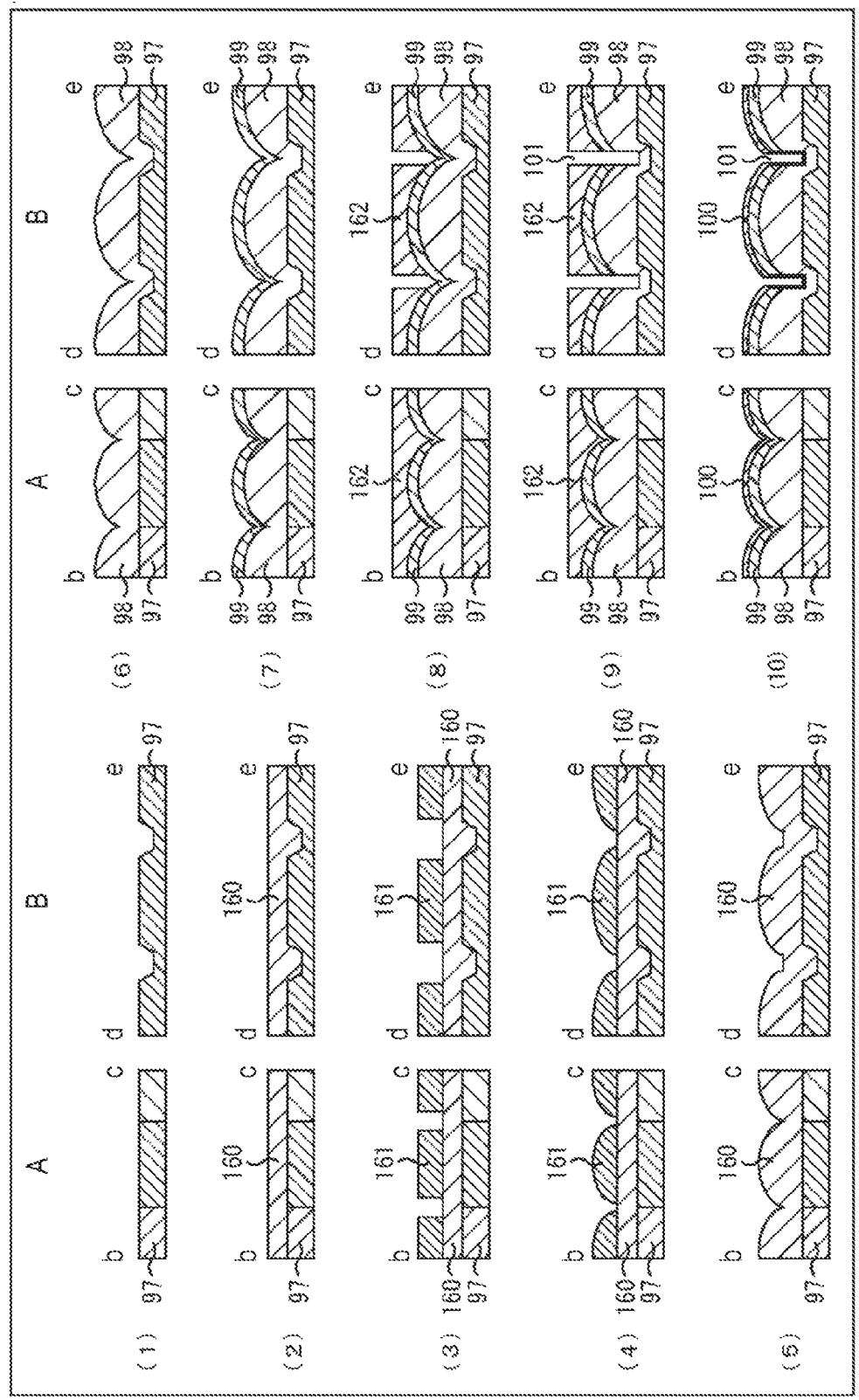
FIG. 9 is a diagram for explaining a method of manufacturing microlenses, an antireflection film, and another antireflection film.

FIG. 9 is a diagram for explaining a method of manufacturing the microlenses 98, the antireflection film 99, and the antireflection film 100, which are to be manufactured after the color filters 97 of all the colors are manufactured.

It should be noted that A of FIG. 9 is a cross-sectional view taken along the line b-c defined in FIG. 2. B of FIG. 9 is a cross-sectional view taken along the line d-e defined in FIG. 2.

First, immediately after the color filters 97 of all the colors are manufactured, the b-c cross-sectional view and the d-e cross-sectional view are as shown in (1) in A of FIG. 9 and (1) in B of FIG. 9.

After that, as shown in (2), a microlens material layer 160 is applied onto the upper surfaces of the color filters 97 by a spin coating method, and are thermally hardened on a hot plate. The microlens material layer 160 is made of an organic resin such as an acrylic, styrene, or novolac resin containing metal fine particles, or a copolymer resin of those resins.

Next, as shown in (3), patterning is performed by a photolithography method, to form resist layers 161 of a photosensitive resin film in the regions corresponding to the respective pixels 71 on the upper surface of the microlens material layer 160.

Then, as shown in (4), the resist layers 161 are subjected to a heating treatment at a higher temperature than the thermal softening point of the resist layers 161, so that the shape of each resist layer 161 has a curved surface protruding upward.

As shown in (5), an etchback process is next performed, and the shape of each resist layer 161 is copied onto the microlens material layer 160. As a result, the length of the bottom surface of the microlens material layer 160 in each pixel 71 in the horizontal direction becomes the length of each pixel 71 in the horizontal direction. However, the length of the bottom surface of the microlens material layer 160 in each pixel 71 in a diagonal direction is smaller than the length of each pixel 71 in the diagonal direction.

Therefore, as shown in (6), etching is then performed on the boundaries between the pixels 71 adjacent to one another in the diagonal direction in the microlens material layer 160. Consequently, the microlenses 98 are formed so that the diagonal and horizontal lengths of the bottom surface of the microlens material layer 160 in each pixel 71 become the diagonal and horizontal lengths of each pixel 71.

As shown in (7), the antireflection film 99 is next formed on the upper surfaces of the microlenses 98 by a plasma CDV method or the like. As shown in (8), patterning is then performed by a photolithography method, so that an antireflection film material layer 162 is applied onto regions on the upper surface of the antireflection film 99 other than the regions of the boundaries between the pixels 71 diagonally adjacent to one another. The antireflection film material layer 162 is an inorganic film, such as a silicon oxide film or a silicon oxycarbide film.

As shown in (9), dry etching is performed, to remove the antireflection film 99 and the microlenses 98 on the boundaries between the pixels 71 that have no antireflection film material layer 162 formed therein and are diagonally adjacent to one another, or at the four corners of each pixel 71. Thus, the moisture permeation holes 101 are formed.

At this point of time, as the recessed portions 97A of the color filters 97 are formed at the four corners of each pixel 71 from which the antireflection film 99 and the microlenses 98 are removed, exposure of the color filters 97 due to overetching can be prevented. As a result, an increase in the dark current of the CMOS image sensor 50 can be prevented.

Specifically, a pigment containing copper or zinc is normally used in the green color filters 97. Therefore, if exposure is performed during dry etching, the chamber of the etching device is contaminated with metal. Further, if the CMOS image sensor 50 is manufactured with the etching device contaminated with metal, dark current or the like increases. In view of this, exposure of the color filters 97 due to dry etching is prevented, so that an increase in dark current can be prevented.

After the antireflection film 99 and the microlenses 98 at the four corners of each pixel 71 are removed, the antireflection film material layer 162 is removed. The antireflection film 100 is then formed on the antireflection film 99 and the moisture permeation holes 101, as shown in (10).

As described above, having the moisture permeation holes 101, the CMOS image sensor 50 can diffuse components such as moisture in the interfaces between the microlenses 98 and the antireflection film 99. As a result, the resistance to high-temperature, high-humidity conditions becomes higher.

Also, the CMOS image sensor 50 has the antireflection film 99 and the antireflection film 100 formed on the upper surfaces of the microlenses 98. Thus, it is possible to reduce occurrences of flare, ghosts, and color mixing due to surface reflection from the microlenses 98.

It should be noted that the antireflection film 100 may not be formed in the moisture permeation holes 101. In this case, the microlenses 98, the antireflection film 99, and the antireflection film 100 are manufactured after the color filters 97 of all the colors are manufactured, as shown in FIG. 10.

Figure 10:
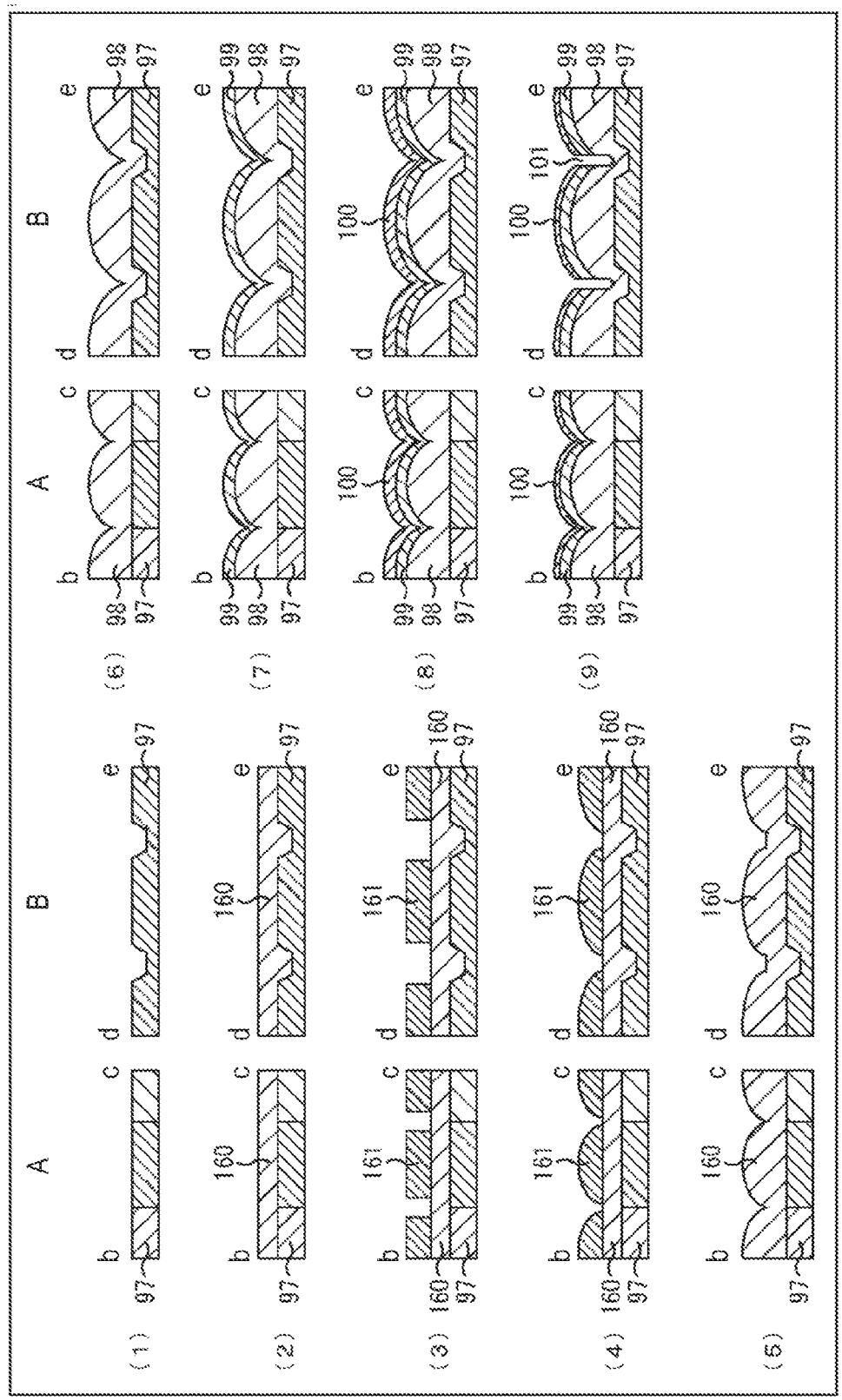
FIG. 10 is a diagram for explaining another method of manufacturing microlenses, an antireflection film, and another antireflection film.

Specifically, A of FIG. 10 is a cross-sectional view taken along the line b-c defined in FIG. 2. B of FIG. 10 is a cross-sectional view taken along the line d-e defined in FIG. 2. Further, (1) through (7) of FIG. 10 are similar to (1) through (7) of FIG. 9, and therefore, explanation of them is not made herein.

In FIG. 10, after the antireflection film 99 is formed on the upper surfaces of the resist layers 161 as shown in (7), the antireflection film 100 is formed on the upper surface of the antireflection film 99 as shown in (8).

Etching is then performed as shown in (9). As a result, the antireflection film 100, the antireflection film 99, and the microlenses 98 at the four corners of each pixel 71 are removed, and the moisture permeation holes 101 are formed.

That is, the antireflection film 100, the antireflection film 99, and the microlenses 98 at the four corners of each pixel 71 have smaller thicknesses than those in the other regions. Accordingly, etching on the antireflection film 100, the antireflection film 99, and the microlenses 98 at the four corners of each pixel 71 is completed quicker than in the other regions, and the moisture permeation holes 101 are formed.

It should be noted that, in a case where the antireflection film 100 is formed in the moisture permeation holes 101, etching may be performed after the antireflection film 99 and the antireflection film 100 are formed on the upper surfaces of the microlenses 98, as shown in FIG. 10. In this case, the antireflection film 100 is formed in the moisture permeation holes 101 after the etching.

Second Embodiment (Structure of the Pixel Region of a Second Embodiment of the CMOS Image Sensor)

The configuration of a second embodiment of the CMOS image sensor as a solid-state imaging device to which the present disclosure is applied is the same as the configuration of the CMOS image sensor 50 shown in FIG. 1, except for the configuration of the pixel region. Therefore, only the configuration of the pixel region is described below.

Figure 11:
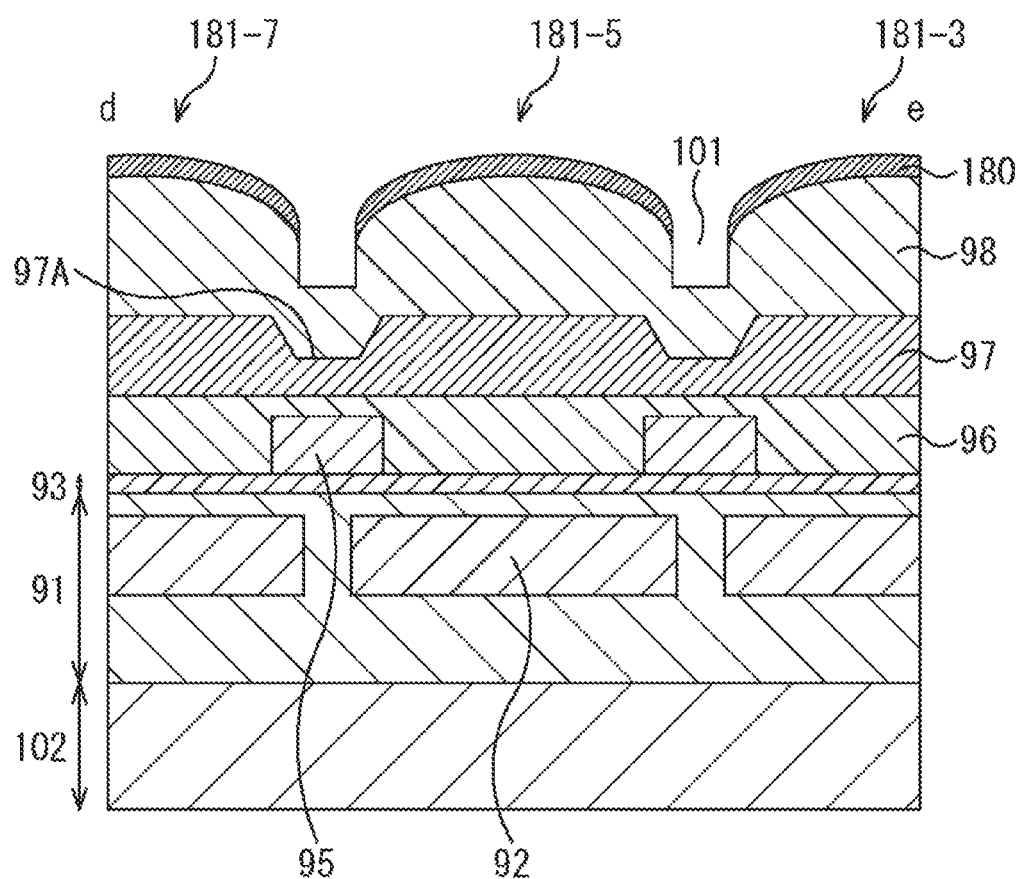
FIG. 11 is a cross-sectional view taken along the line d-e defined in FIG. 2, showing the configuration of a pixel region of a second embodiment of the CMOS image sensor.
Figure 12:
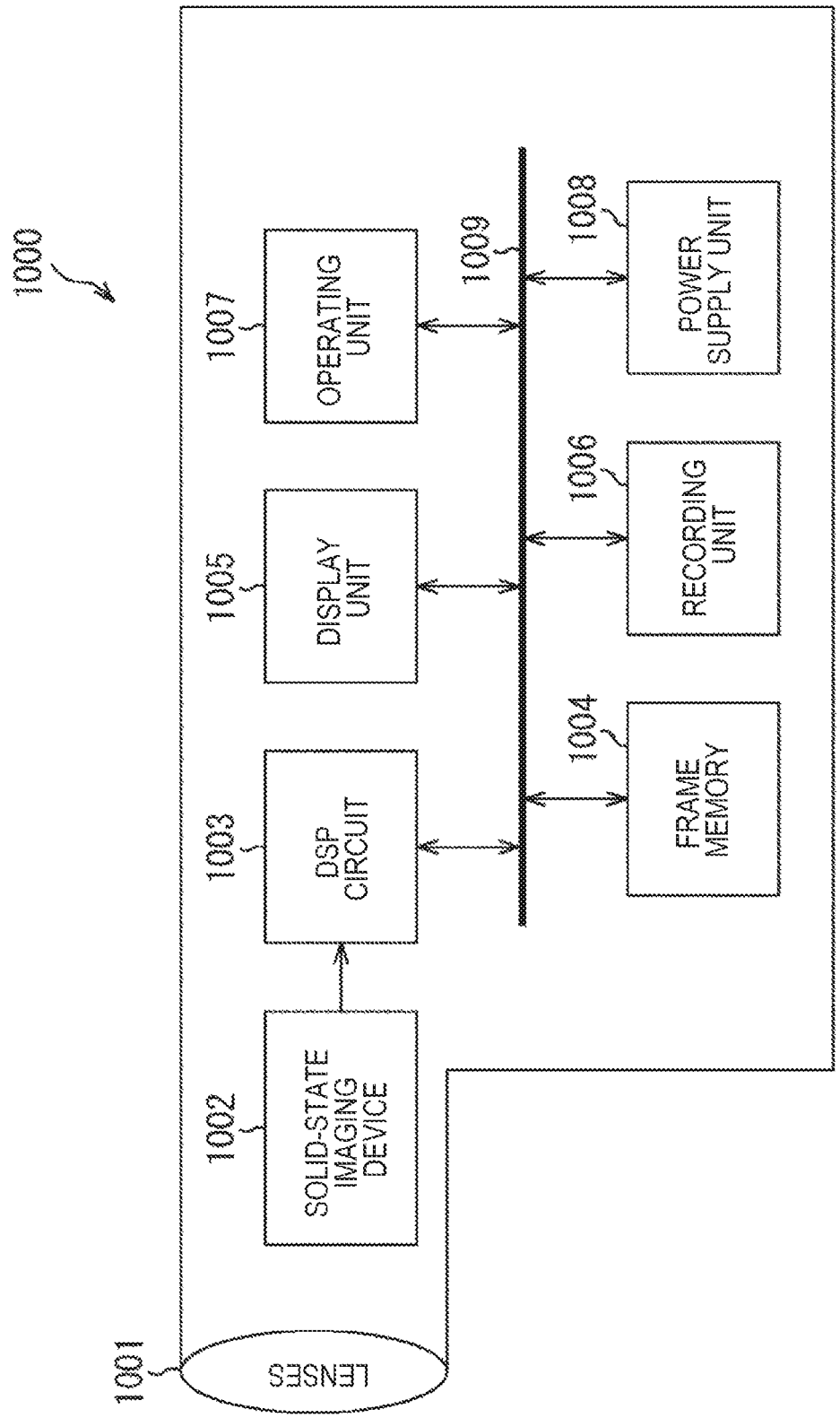
FIG. 12 is a block diagram showing an example configuration of an imaging apparatus as an electronic apparatus to which the present disclosure is applied.

FIG. 11 is a cross-sectional view taken along the line d-e defined in FIG. 2, showing the configuration of the pixel region of the second embodiment of the CMOS image sensor.

In the configuration shown in FIG. 11, the same components as those shown in FIG. 4 are denoted by the same reference numerals as those used in FIG. 4. The explanations that have already been made will not be repeated.

The configuration of the pixels 181-3, 181-5, and 181-7 in FIG. 11 differs from the configuration of the pixels 71-3, 71-5, and 71-7 in FIG. 4, in that an antireflection film 180 is provided in place of the antireflection film 99 and the antireflection film 100, and the antireflection film 100 is not formed on the moisture permeation holes 101.

Specifically, only the single antireflection film 180 of an inorganic film such as a $SiO_2$ film with a low refractive index is formed on the microlenses 98 in FIG. 11, and the antireflection film 100 is not formed on the moisture permeation holes 101.

In this case, the components in the interfaces between the antireflection film 180 and the microlenses 98 can be diffused more effectively than in a case where the moisture permeation holes 101 are not formed. Accordingly, even in a situation where reactive substances generated by a heat treatment or the like in part of the regions of the interfaces between the antireflection film 180 and the microlenses 98 reduce or transform the color filters 97, the substances are released through the moisture permeation holes 101, and thus, the reduction and the transformation of the color filters 97 can be restrained. As a result, image quality degradation due to local variation in light transmittance can be prevented.

Third Embodiment (Example Configuration of an Embodiment of an Imaging Apparatus)

FIG. 12 is a block diagram showing an example configuration of an imaging apparatus as an electronic apparatus to which the present disclosure is applied.

The imaging apparatus 1000 in FIG. 12 is a video camera, a digital still camera, or the like. The imaging apparatus 1000 includes lenses 1001, a solid-state imaging device 1002, a DSP circuit 1003, a frame memory 1004, a display unit 1005, a recording unit 1006, an operating unit 1007, and a power supply unit 1008. The DSP circuit 1003, the frame memory 1004, the display unit 1005, the recording unit 1006, the operating unit 1007, and the power supply unit 1008 are connected to one another via a bus line 1009.

The lenses 1001 gather incident light (image light) from an object and forms an image on the imaging surface of the solid-state imaging device 1002. The solid-state imaging device 1002 is formed with the above described CMOS image sensor. The solid-state imaging device 1002 converts the quantity of the incident light, which has been gathered as an image on the imaging surface by the lenses 1001, into an electrical signal for each pixel, and supplies the electrical signal as a pixel signal to the DSP circuit 1003.

The DSP circuit 1003 performs predetermined image processing on the pixel signals supplied from the solid-state imaging device 1002, and supplies the image signals subjected to the image processing to the frame memory 1004 on a frame basis. The image signals are temporarily stored in the frame memory 1004.

A display unit 1005 is formed with a panel display device, such as a liquid crystal panel or an organic electroluminescence (EL) panel, and displays an image in accordance with the pixel signals of each frame temporarily stored in the frame memory 1004.

The recording unit 1006 is formed with a digital versatile disk (DVD), a flash memory, or the like. The recording unit 1006 reads the pixel signals of each frame temporarily stored in the frame memory 1004, and records the pixel signals therein.

When operated by a user, the operating unit 1007 issues operating instructions as to various functions of the imaging apparatus 1000. The power supply unit 1008 supplies power to the DSP circuit 1003, the frame memory 1004, the display unit 1005, the recording unit 1006, and the operating unit 1007, as appropriate.

The electronic apparatus to which the present technology is applied is an apparatus using a CMOS image sensor in an image capturing unit (a photoelectric conversion unit). Other than the imaging apparatus 1000, the electronic apparatus may be a portable terminal device having an imaging function, a copying machine using a CMOS image sensor in an image reading unit, or the like.

It should be noted that the advantageous effects described in this specification are merely examples, and the advantageous effects of the present technology are not limited to them and may include other effects.

Also, an embodiment of the present disclosure is not limited to the above-described embodiments and various modifications can be made within the spirit and the scope of the present disclosure.

For example, the positions of the moisture permeation holes 101 are not limited to the four corners of the microlens 98 of each pixel 71, but may be any appropriate positions in each pixel 71.

The present disclosure may also be embodied in the configurations described below.

(1)
A solid-state imaging device including:
microlenses of respective pixels;
diffusion holes formed between the microlenses of the pixels adjacent to one another, the diffusion holes being covered with an inorganic film; and
a first antireflection film formed on surfaces of the microlenses excluding the diffusion holes, the first antireflection film having a higher refractive index than the microlenses.

(2)
The solid-state imaging device of (1), further including color filters provided under the microlenses,
wherein the diffusion holes are formed in recessed portions of the color filters.

(3)
The solid-state imaging device of (2), further including light shielding portions provided under portions between the color filters of the pixels adjacent to one another.

(4)
The solid-state imaging device of any of (1) to (3), further including
a second antireflection film provided on the first antireflection film,
wherein the inorganic film is the same film as the second antireflection film.

(5)
A method of manufacturing a solid-state imaging device including:
microlenses of respective pixels;
diffusion holes formed between the microlenses of the pixels adjacent to one another, the diffusion holes being covered with an inorganic film; and
a first antireflection film formed on surfaces of the microlenses excluding the diffusion holes, the first antireflection film having a higher refractive index than the microlenses.

(6)
An electronic apparatus including:
microlenses of respective pixels;
diffusion holes formed between the microlenses of the pixels adjacent to one another, the diffusion holes being covered with an inorganic film; and
a first antireflection film formed on surfaces of the microlenses excluding the diffusion holes, the first antireflection film having a higher refractive index than the microlenses.

(7)
A solid-state imaging device including:
microlenses of respective pixels;
diffusion holes formed between the microlenses of the pixels adjacent to one another; and
an antireflection film formed on surfaces of the microlenses excluding the diffusion holes.

(8)
A method of manufacturing a solid-state imaging device including:
microlenses of respective pixels;
diffusion holes formed between the microlenses of the pixels adjacent to one another; and
an antireflection film formed on surfaces of the microlenses excluding the diffusion holes.

(9)
An electronic apparatus including:
microlenses of respective pixels;
diffusion holes formed between the microlenses of the pixels adjacent to one another; and
an antireflection film formed on surfaces of the microlenses excluding the diffusion holes.

REFERENCE SIGNS LIST

50 CMOS image sensor
71 Pixel
95 Light shielding portion
97 Color filter
97A Recessed portion
98 Microlens
99 Antireflection film
100 Antireflection film
101 Moisture permeation hole

The invention claimed is:
1. A solid-state imaging device, comprising:
a plurality of pixels,
wherein each pixel of the plurality of pixels comprises a microlens;
at least one diffusion hole between two consecutive microlenses,
wherein the at least one diffusion hole is covered with an inorganic film, and
wherein a width of the at least one diffusion hole is one of equal to or smaller than a wavelength of visible light; and
a first antireflection film on the microlens,
wherein a first refractive index of the first antireflection film is higher than a second refractive index of the microlens.
2. The solid-state imaging device according to claim 1, further comprising color filters under the microlens, wherein the at least one diffusion hole is in a recessed portion of a plurality of recessed portions of the color filters.

3. The solid-state imaging device according to claim 2, further comprising light shielding portions under the color filters and the at least one diffusion hole.

4. The solid-state imaging device according to claim 1, further comprising a second antireflection film on the first antireflection film,
wherein the inorganic film is the second antireflection film.

5. The solid-state imaging device according to claim 1, wherein the inorganic film is one of a silicon oxide film ($SiO_2$) or a silicon oxycarbide film (SiOC).

6. The solid-state imaging device according to claim 1, wherein a third refractive index of the inorganic film is lower than the first refractive index of the first antireflection film and the second refractive index of the microlens.

7. A method of manufacturing a solid-state imaging device including a plurality of pixels, the method comprising:
forming a microlens of each pixel of the plurality of pixels;
forming at least one diffusion hole between two consecutive microlenses;
covering the at least one diffusion hole with an inorganic film,
wherein a width of the at least one diffusion hole is one of equal to or smaller than a wavelength of visible light; and
forming a first antireflection film on the microlens,
wherein a first refractive index of the first antireflection film is higher than a second refractive index of the microlens.

8. An electronic apparatus, comprising:
a plurality of pixels,
wherein each pixel of the plurality of pixels comprises a microlens;
at least one diffusion hole between two consecutive microlenses,
wherein the at least one diffusion hole is covered with an inorganic film, and
wherein a width of the at least one diffusion hole is one of equal to or smaller than a wavelength of visible light; and
a first antireflection film on the microlens,
wherein a first refractive index of the first antireflection film is higher than a second refractive index of the microlens.

9. A solid-state imaging device, comprising:
a plurality of pixels,
wherein each pixel of the plurality of pixels comprises a microlens;
at least one diffusion hole between two consecutive microlenses,
wherein a width of the at least one diffusion hole is one of equal to or smaller than a wavelength of visible light; and
an antireflection film on the microlens.

10. A method of manufacturing a solid-state imaging device including a plurality of pixels, the method comprising:
forming a microlens of each pixel of the plurality of pixels;
forming at least one diffusion hole between two consecutive microlenses,
wherein a width of the at least one diffusion hole is one of equal to or smaller than a wavelength of visible light; and
forming an antireflection film on the microlens.

11. A electronic apparatus, comprising:
a plurality of pixels,
wherein each pixel of the plurality of pixels comprises a microlens;
at least one diffusion hole between two consecutive microlenses,
wherein a width of the at least one diffusion hole is one of equal to or smaller than a wavelength of visible light; and
an antireflection film on the microlens.

12. A solid-state imaging device, comprising:
a plurality of pixels,
wherein each pixel of the plurality of pixels comprises a microlens;
at least one diffusion hole between two consecutive microlenses,
wherein the at least one diffusion hole is covered with an inorganic film,
a first antireflection film on the microlens,
wherein a first refractive index of the first antireflection film is higher than a second refractive index of the microlens; and
a second antireflection film on the first antireflection film,
wherein the inorganic film is the second antireflection film.

* * * * *